United States Patent [19]

Falater et al.

[11] Patent Number: 4,567,385
[45] Date of Patent: Jan. 28, 1986

[54] POWER SWITCHED LOGIC GATES

[75] Inventors: Scott L. Falater; James D. Beasom, both of Melbourne, Fla.

[73] Assignee: Harris Corporation, Melbourne, Fla.

[21] Appl. No.: 506,794

[22] Filed: Jun. 22, 1983

[51] Int. Cl.[4] ............... H03K 19/003; H03K 19/094; H03K 19/20

[52] U.S. Cl. .................................... 307/443; 307/451; 307/449; 307/463; 307/242; 307/243; 307/469

[58] Field of Search ............... 307/448, 449, 451, 463, 307/465, 468, 469, 442, 443, 452, 453, 241–243; 364/716

[56] References Cited

U.S. PATENT DOCUMENTS

| | | |
|---|---|---|
| 4,084,152 | 4/1978 | Long et al. |
| 4,233,524 | 11/1980 | Burdick. |
| 4,233,667 | 11/1980 | Devine et al. ............ 364/900 |
| 4,344,005 | 8/1982 | Stewart .................. 307/463 |
| 4,408,135 | 10/1983 | Yuyama et al. ........... 307/474 |

Primary Examiner—Larry N. Anagnos
Attorney, Agent, or Firm—Barnes & Thornburg

[57] ABSTRACT

A plurality of logic gates having common data inputs are selected by activation and deactivation of switches connecting the logic gates to circuit power terminals. In one embodiment both power leads of the logic gate are connected by two power switches to two circuit power terminals. In a second embodiment, the first power lead of the logic gate is continuously connected to the first circuit power terminal and the second gate power lead is connected to the second circuit power terminal by a first power switch for a select and to the first circuit power terminal by a second power switch for a deselect. The second embodiment includes a buffer inverter on each logic gate output whose power leads are connected to the circuit power terminals as are the logic gates. Alternatively, the second switch could connect the input of the inverter to the first circuit power terminal for a deselect.

25 Claims, 7 Drawing Figures

POWER SWITCHED LOGIC GATES

BACKGROUND OF THE INVENTION

The present invention relates generally to logic circuits, and more specifically to a logic circuit whose configuration is selectable.

Logic circuits being configurable upon command are well known and exemplified by U.S. Pat. No. 4,233,524 to Burdick. Switchable devices in the transmission path between the input transistors and the output control the logical configuration. Another example of switchable logic is a time shared programmable logic array in U.S. Pat. No. 4,084,152 to Long et al. In this patent, the drains of the transistors of the OR matrix 20 are either permanently connected to ground, permanently unconnected, or connected by switch elements 40 or 42 such that the configuration of the OR matrix may be modified or used on a time shared basis. The Lang et al patent deals with single switches or transistors at each of the intersections to form the OR matrix and not complex logic gates including a plurality of complementary field effect transistors to form the logic gates.

SUMMARY OF THE INVENTION

An object of the present invention is to provide an improved complementary field effect transistor logic gate which will not provide an output when deselected as a result of leakage current.

Another object of the present invention is to provide complementary field effect transistor logic gate with power switching circuitry to select and deselect the logic gates.

Still further object of the present invention is to provide a plurality of logic gates having common inputs connected to a common output which are individually selectable by power switches.

These and other objects of the present invention are obtained by providing select-deselect means including a first switch connecting the logic means to a first circuit power terminal and responsive to the select-deselect signal to prevent the deselected logic gate from producing an undesirable output as a result of the data input and leakage current, and a second switch between a second circuit power terminal and a second logic means power lead to connect and disconnect the second logic means power lead from a second circuit power terminal as a function of the select-deselect signal. A buffer inverter is provided between the output of logic gate and the output inverter and the second power lead of the buffer is connected to the second circuit power terminal by said second switch. In a first embodiment, the second power leads of the logic gate and the buffer inverter are connected to the first power terminal by said first switch during deselect. In a second embodiment, the input of the buffer inverter is connected to the first power terminal by the first switch responsive to the deselect signal to maintain the input of the buffer inverter high, and thereby leakage current from the logic gate is not transmitted to the buffer inverter. In the third embodiment, the logic gates do not include a buffer inverter and the sources of the N and P channel logic gate devices are connected to the first and second power terminals by the first and second switches responsive to the select-deselect signal to connect and disconnect the logic gates from the power terminals. In all three embodiments, the plurality of logic gates have common data inputs and may be controlled by a single select signal and select control logic or a plurality of select signals and corresponding plurality of select logic. Preferably the plurality of logic gates had a single output inverter but alternatively they provide separate and distinct outputs. In the third embodiment, select and deselect logic for the output buffer may be used since the individual logic gates do not have inverter buffers.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
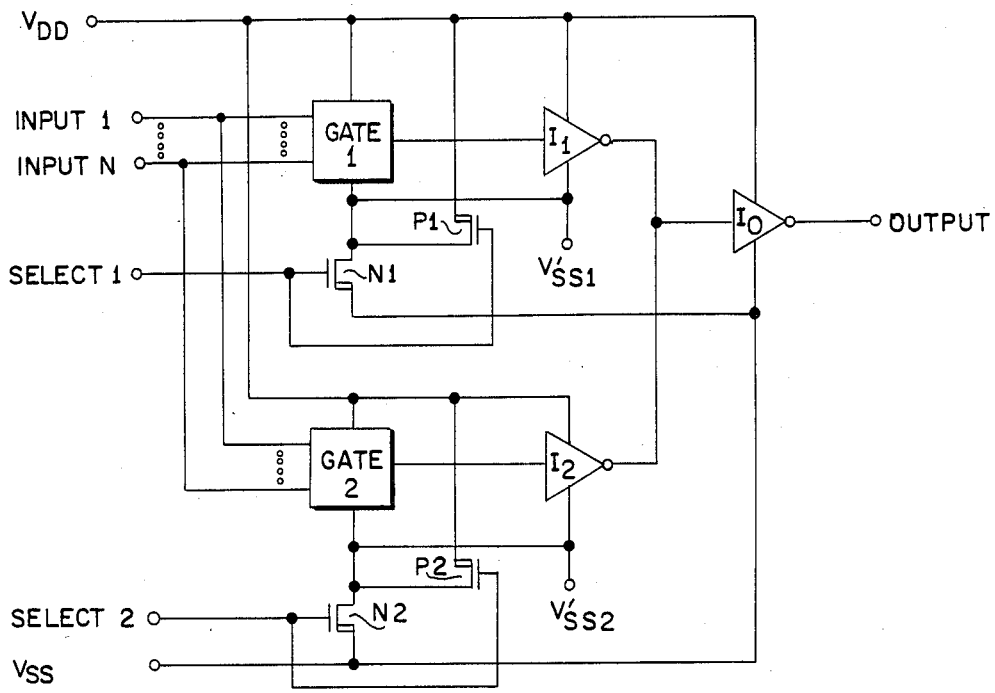
FIG. 1 is a schematic of a first embodiment, of a selectable logic circuit incorporating the principle of the present invention.

Two logic gates, gate 1 and gate 2 are illustrated in FIG. 1 as connected in parallel between the plurality of inputs Input 1 to Input N and to a common output inverter I0. Each of the gates are controlled by separate select signals Select 1 and Select 2 and include select logic to control which gate is activated and which is deactivated. A first and second power terminals supply voltages VDD and VSS respectively. The logic gates gate 1 and 2 generally include complementary P and N channel devices to perform the appropriate gate logic.

Figure 2:
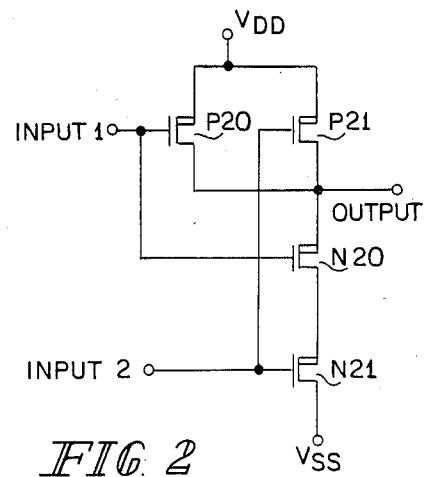
FIG. 2 is a schematic of a NAND gate.

A typical example is illustrated in FIG. 2 as a NAND gate having parallel connected P channel devices P20 and P21 and series connected N channel devices N20 and N21. The gates of the individual devices are connected to appropriate inputs input 1 and 2. The sources of the P channel devices are connected to the voltage terminal VDD and the source of the N channel devices are connected to the voltage terminal VSS. The operation of the NAND gate of FIG. 2 is well known and is only illustrated since the invention will be explained relative to gates having complementary P and N channel devices.

The first embodiment of the select logic as illustrated in FIG. 1 includes a first power lead of the logic gate connected directly to the first power terminal VDD, a second switch shown as an N channel device connected between the second power lead of the logic gate and the second power terminal VSS by its source-drain path and a first switch shown as a P channel device connecting the second power lead of the logic gate to the first power terminal VDD by its source-drain path. The gates of the P and N channel logic select switches have their gates connected to the select logic. As illustrated, logic gate 1 includes N channel device N1 and P channel device P1 and gate 2 includes the N channel device N2 and P channel device P2 forming individual select logic responsive to select signals Select 1 and 2 respectively. Connected to the output of each of the logic gates is a buffer inverter I1 for logic gate 1, and I2 for logic gate 2. The first power leads of inverters I1 and I2 are connected directly to the first power terminal VDD and the second power leads or sources of the N channel devices of the inverters I1 and I2 are connected to the first and second power terminals VDD and VSS by P and N channel logic switches P1, P2 and N1, N2 respectively. The outputs of the buffer inverters I1 and I2 are connected to the output buffer I0.

When a select signal is applied to the gates of the N and P channel select switches, the N channel device is turned on to connect the sources of the N channel devices of the gate logic and the buffer inverters to the second terminal VSS and allows the gate logic and buffer inverters to operate in response to the data inputs and the P channel select switch is off. In response to a deselect signal, the N channel select switch is off disconnecting the sources of the N channel device of the gate logic and buffer inverter from the second power terminal VSS and the P channel select switch is activated to connect the sources of the N channel device of the logic and the buffer inverter to the first power terminal VDD. Since the sources of the P channel device of the logic gate and the inverter buffer are continuously connected to the first power terminal VDD, the disconnection of the sources of the logic gate N channel devices by N channel select switch by itself will not prevent accidental transmission of a logic signal. Without the buffer inverter, the input of the common output inverter I0 will be driven to VDD by the deselected P channel devices of the gate logic whenever the input to the deselected gate logic are high output code for that gate logic. With the buffer inverter present, this high output from the P channel devices of the gate logic drives the buffer inverter input high which would normally activate the N channel device of the buffer inverter, but since the source of the N channel device has been disconnected by the deselect transistor N1, the buffer inverter maintains a high impedance state at the input of the common output inverter thus provides on logic output.

The P channel select switches are turned on when the gate is deselected. They pull the second power lead of the logic gate and the buffer inverter to the first power terminal voltage VDD, thus defining the state of the buffer inverter output as high impedance. If the P channel deselect logic device is not used, it is possible for the voltage at VSS' to drop near VSS due to the voltage divider action between the deselected gate logic and the N channel select switch. Should this happen and the input data lines have the code for an output low for the deselected logic gate, the buffer inverter input would be pulled low through the N channel device of the gate logic turned on by the input lines. This would turn on the P channel device of the buffer inverter which is continuously connected to the VDD and drive the common output inverter. By connecting the second power lead of the logic gate and the sources of the N channel devices of the buffer inverter to the first power terminal VDD, prevents the gate logic from providing a logic low signal on the input of the buffer inverter and prevents the buffer inverter from providing any output signal.

Alternativley, the P channel select switches P1 and P2 may be replaced by resistors or current sources which continuously connect the first circuit power terminal to the logic gate's second power lead. This biases up the gate's second power lead when the N channel select switch is deactivated.

Figure 3:
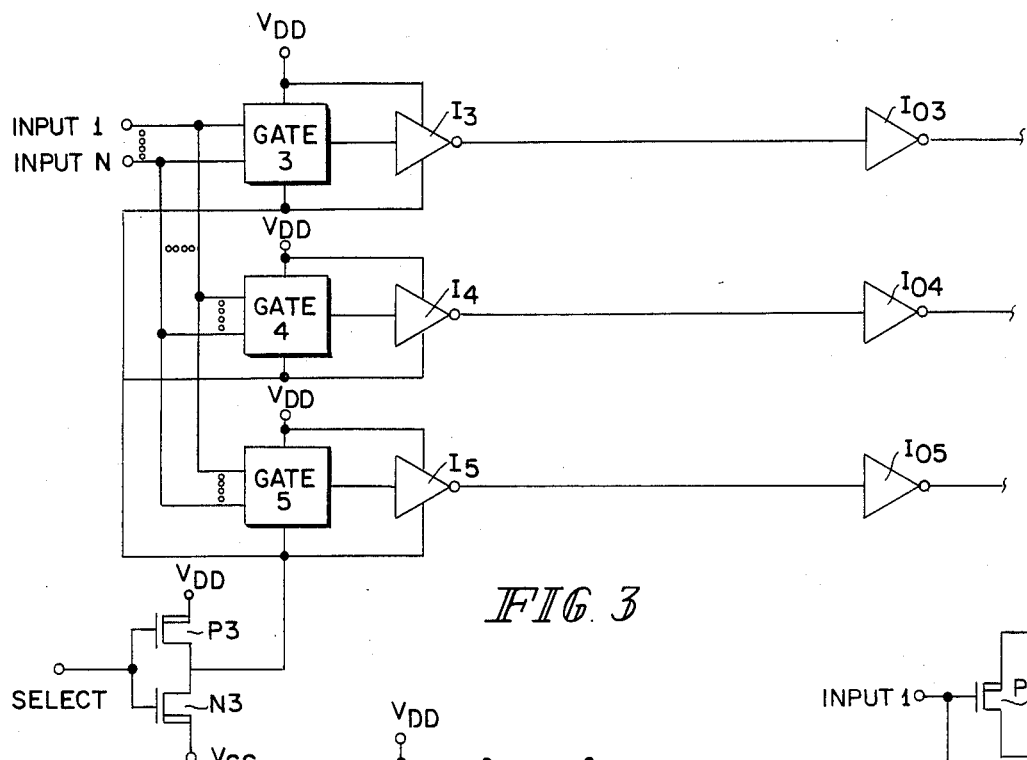
FIG. 3 is a schematic of a modification of the selectable logic circuit of FIG. 1.

The embodiment of FIG. 1 specifically shows two logic gates connected in parallel between a plurality of inputs and a common output inverter I0. Each of the logic gates includes its own select-deselect logic responsive to separate and distinct select and deselect signals Select 1 and Select 2. FIG. 3 shows the use of a single deselect logic of FIG. 1 for a plurality of logic gates Gate 3, Gate 4 and Gate 5. The logic gates are connected in parallel to a plurality of inputs Input 1 through Input N. Each of the individual gates includes buffer inverters I3, I4 and I5, and output buffers I03, I04, and I05 respectively. The common select-deselect logic includes P channel switch P3 and N channel switch N3 having their gates connected to the select-deselect signal and their source-drain path connecting the sources of the N channel devices of the logic gates and the buffer inverters to the first and second power sources VDD and VSS respectively. The operation of the select-deselect logic is the same as explained from FIG. 1. The possibility of selecting sets of functions with each select pin allows a greater number of circuits to be provided in a package of a given pin count.

Figure 7:
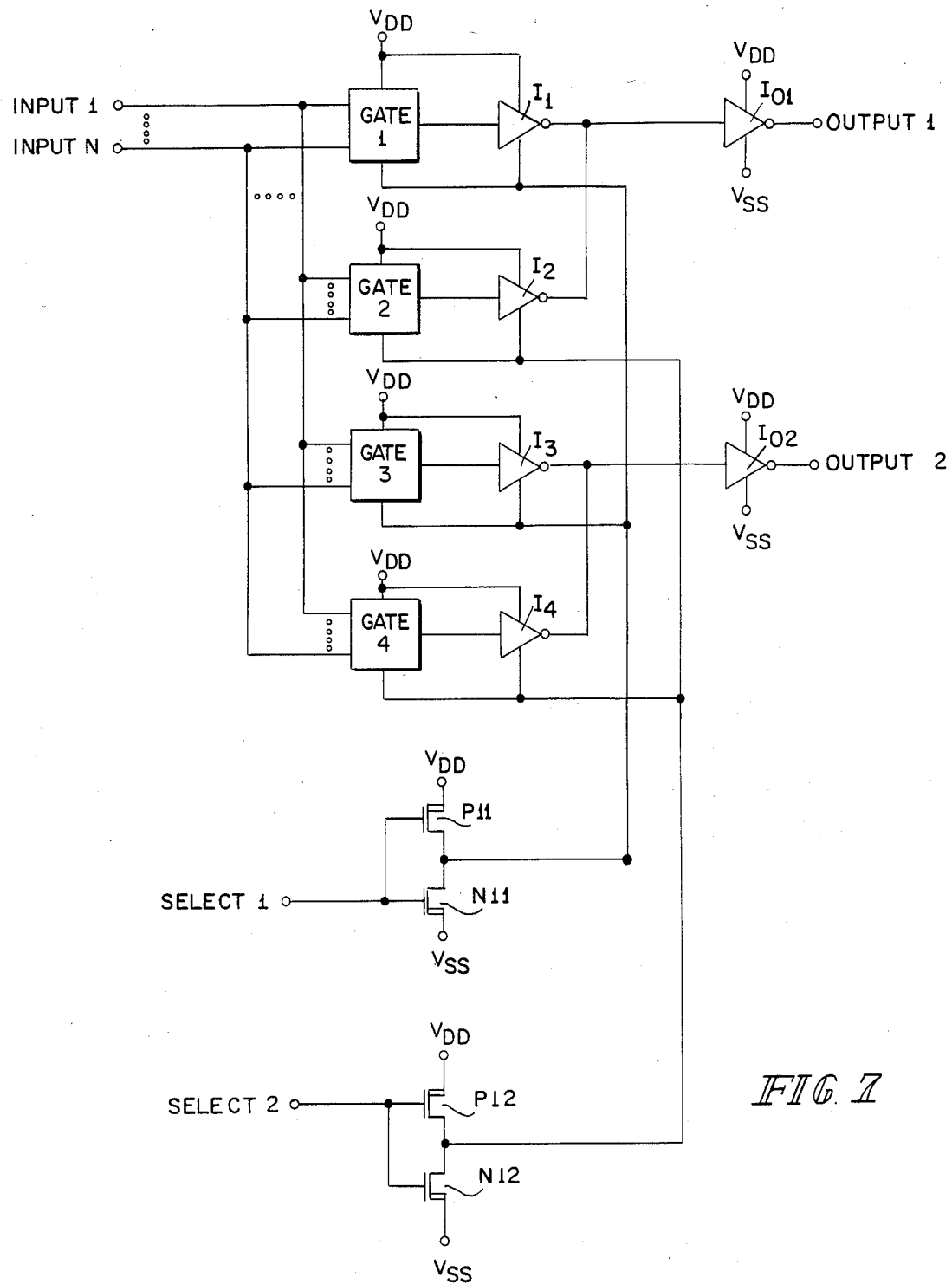
FIG. 7 is a schematic of a modification of the selectable logic of FIG. 1.

The circuit of FIG. 3 may be provided in the circuit of FIG. 1 such that Select 1 and Select 2 both activate a plurality of logic gates as illustrated in FIG. 7. Four gates, Gate 1 through Gate 4, are connected in parallel to a plurality of inputs Input 1 through Input N. Gates 1 and 2 are connected to a common output buffer I01 by buffer inverters I1 and I2 respectively. Gates 3 and 4 are connected to a common output buffer I02 by buffer inverters I3 and I4 respectively. Select-deselect logic 1 including switch P11 and N11 control Gate 1 and buffer inverter I1 and Gate 3 and buffer inverter I3. Select and deselect logic 2 including switches P12 and N12 control Gate 2 and buffer inverter I2 and Gate 4 and buffer inverter I4. For select 1 high, the output buffer I01 receives signals only from Gate 1 and buffer inverter 1 and output buffer I02 receives signals only from Gate 3 and buffer inverter I3. For Select 2 high, output buffer I01 receives signals only from Gate 2 and inverter buffer I2 and output buffer I02 receives signals only from Gate 4 and inverter buffer I4.

Although FIG. 7 shows only a pair of select and deselect logic for a pair of output buffers, many more gates per output buffers may be selected using additional select logic and many more gates with additional common output buffers may be controlled by common select logic.

The use of a common output inverter I0 for the plurality of logic gates saves die area because the output inverter devices must be large to provide high current to drive useful loads. Furthermore the output inverter I0 need not be power switched because it is common to all logic gates. Thus the select logic switches can be made smaller because they need not conduct the output current through the large devices of the output buffer I0. This saves die area and also reduces leakage current associated with the plurality of select logic switches.

In applications with low current loads, the propagation delay of output inverter may be undesirable. In these applications, the output inverter may be eliminated and the outputs from the buffer inverters can be taken as the common line.

Figure 4:
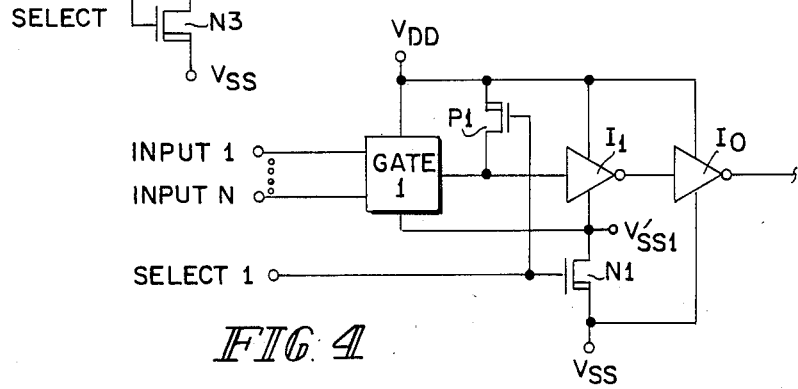
FIG. 4 is a further modification of the selectable logic of FIG. 1.

A modification of the embodiment of FIG. 1 is illustrated in FIG. 4 wherein the P channel select switch P1 has its drain connected to the input of the buffer inverter I1 and its source connected to VDD. The P channel select switch P1, when activated during a deselect, provides a high input to the buffer inverter which maintains the P channel device of the buffer inverter off. The N channel device of the buffer inverter could be turned on in the case where VSS' is near VSS as previously described. However the buffer inverter remains in a high impedance condition because the N channel select switch N1 blocks source current flow. Thus the buffer inverter I1 maintains its high impedance state. Although FIG. 4 illustrates a modification of FIG. 1 for logic gate 1, it can be incorporated into deselect logic of logic gate 2. As in FIG. 1, the select switch P1 can be replaced by a resistor or current source.

Alternatively, in the embodiments of FIGS. 1, 3 and 4, the first select switches P could connect VDD to the first power lead of the logic gate and buffer inverter and the second select, switch N could connect the the second power lead of the logic gate and buffer inverter in FIG. 1 and 3 or the input to buffer inverter to VSS.

Figure 5:
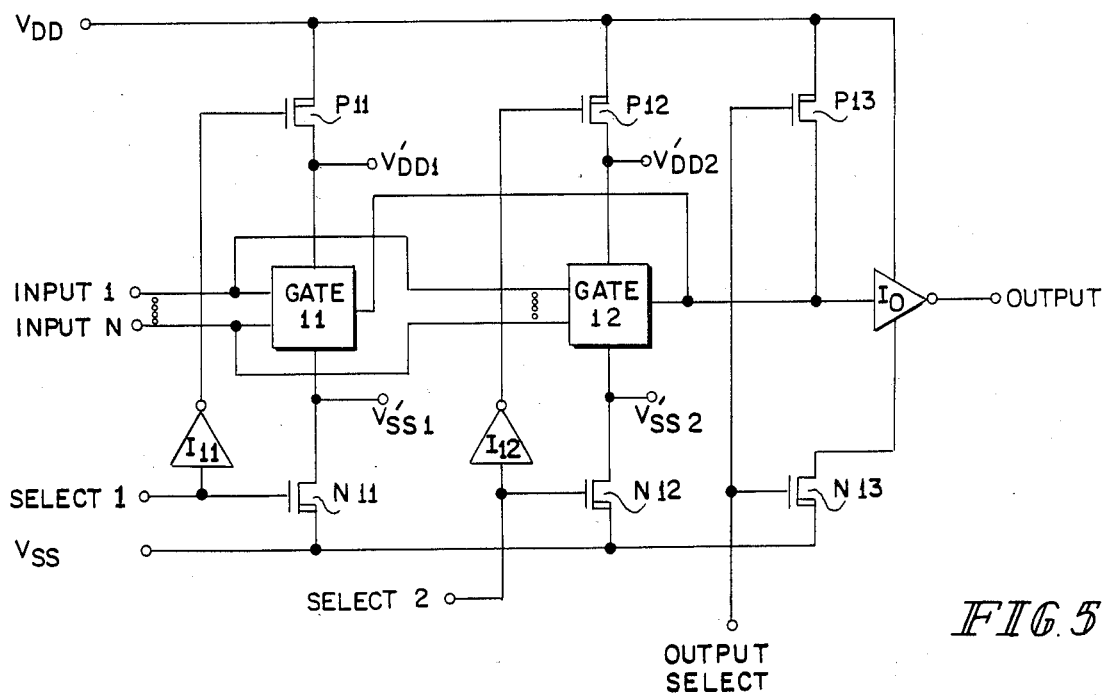
FIG. 5 is a schematic of a second embodiment of a selectable logic circuit incorporated in the present invention.

Another embodiment of the present invention is illustrated in FIG. 5 wherein the first and second power leads of the logic gates are connected to the first and second power terminals respectively by a first switch shown as a P channel device and a second switch shown as an N channel device controlled by the select logic. Two logic gates, illustrated as gate 11 and 12, are connected in parallel between the data input terminals input 1 through N and the output inverter I0. The select logic for logic gate 11 includes N channel device N11 and P channel device P11 connected between the sources of the logic gate and power terminals VSS and VDD respectively. A Select I signal is provided directly to the gate of select switch N11 and inverter I11 connects the select signal to select switch P11. Logic Gate 12 has select logic including P channel device P12 and N channel device N12 connecting the power leads of the logic gate 12 to the power terminals VDD and VSS respectively. A Select 2 signal is provided to the gate of N channel switch N12 and inverter I12 connects the select signal to the gate of the P channel switch P12.

An output select logic includes switches or N channel switch N13 connecting the source of the N channel device of the output inverter I0 to the supply terminal VSS and a P channel switch P13 connects the input of the output inverter I0 to the power terminal VDD. An output select signal is provided to the gate of the output select switch N13 and P13. The operation of the output select logic switch is similar to that described for FIG. 4 wherein when the output is deselected, N channel switch N13 is off isolating the N channel device of the output inverter from the voltage source VSS and the P channel switch P13 is on tying the input of the inverter to the voltage source VDD and preventing activation of the P channel device of the output inverter I0. As in FIG. 4, switch P13 can be replaced by a resistor or current source.

When a select signal is provided to the logic select switches, the N channel device N11, N12 is activated providing a connection of the second power lead of the logic gate to the voltage source terminal VSS and the P channel switch P11, P12 is activated to connect the first power lead of the logic gate to the voltage source VDD. Upon a deselect signal, both the N channel devices N11, N12 and P channel device P11, P12 are deactivated for isolating the logic gate from the voltage sources.

An advantage of the embodiment of FIG. 5 compared to that of FIG. 1 is that the buffer inverters are not required since the select logic puts a high impedance in series with each of the logic gates' supplies when it is deselected. One disadvantage of FIG. 5 is the fact that two relatively large select logic switches are required because gate supply current flows through both of the select logics when the gate is selected rather than the one N channel switch of FIG. 1. For comparable levels of performance, the select logic devices of FIG. 5 require about four times the area than would be required by FIG. 1.

Figure 6:
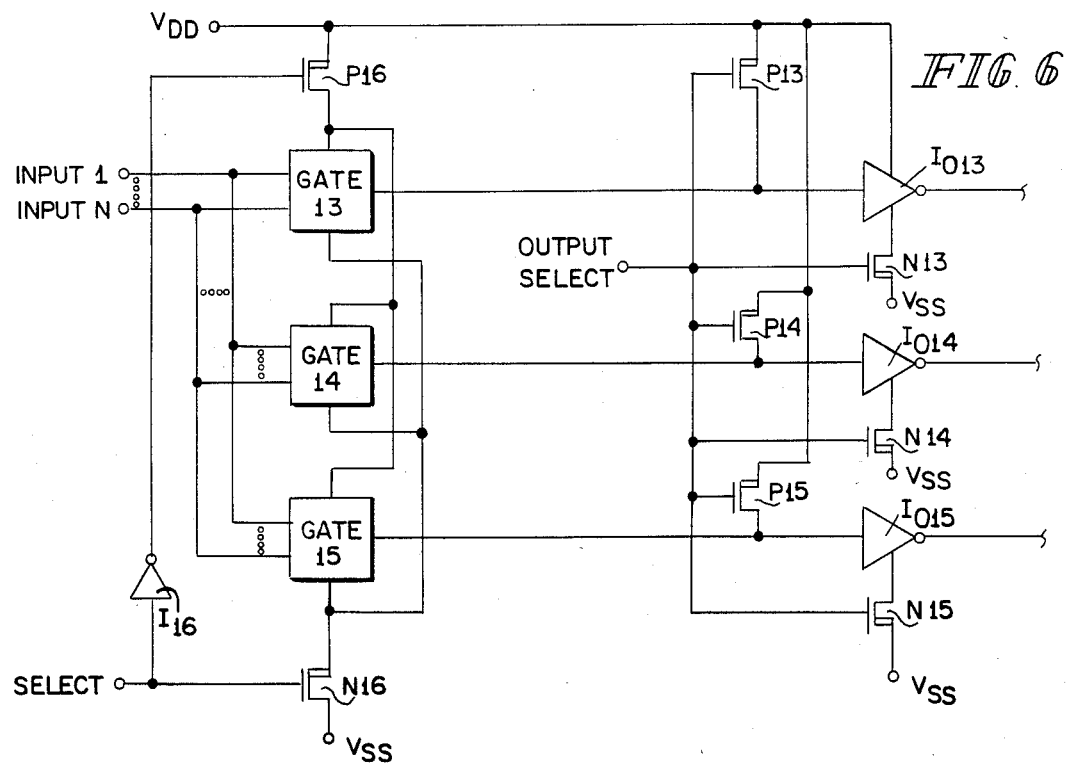
FIG. 6 is a schematic of a modification of the selectable logic of FIG. 5.

As with FIG. 1, FIG. 5 may include plurality of parallel logic gates having their input connected to common inputs and controlled by a single set of select logic switches. This is specifically illustrated in FIG. 6 including parallel connected logic gates 13, 14 and 15 controlled by a set of single select logic having switches N16 and P16 and inverter I16. Each of the output buffers I013, I014, and I015 are controlled by separate output select switches P13/N13, P14/N14 and P15/N15 respectively. It should also be noted that the embodiments of FIG. 5 and 6 may eliminate the output buffers and the outputs from the individual logic gates may be taken directly.

From the preceding description of the preferred embodiments it is evident that the objects of the invention are attained and although the invention has been described and illustrated in detail, it is to be clearly understood that same is by way of illustration and example only and is not to be taken as a way of limitation. The spirit and scope of this invention are to be limited only by the terms of the claims.

What is claimed is:
1. A selectable logic circuit comprising:
circuit input means for receiving data input signals;
first and second circuit power terminals;
a plurality of logic means connected in parallel to said circuit input means for producing output signals at its output as a logical function of said data input signals and having first and second logic power leads;
a plurality of buffer means each connected to the output of a respective logic means and having first and second buffer power leads;
said first logic power lead and said first buffer power lead being continuously connected to said first circuit power terminal; and
select means having a select input and being connected to said first and second circuit power terminals and to the second logic power leads and the second buffer power lead for connecting said second logic and buffer power leads to said second circuit power terminal in response to a select signal and to said first circuit power terminal in response to a deselect signal.

2. A selectable logic circuit according to claim 1 wherein said select means includes an N channel device having its source-drain path connected from said second logic power leads and said second buffer power leads to said second circuit power terminal and its gate connected to said select input, and a P channel device having its source-drain path connected from said second logic power lead and said second buffer power lead to said first circuit power terminal and its gate connected to said select input.

3. A selectable logic circuit according to claim 1 including select means connected to each pair of logic means and buffer means, each of said select means being responsive to a separate select signal.

4. A selectable logic circuit according to claim 1 including an output means for providing a circuit output signal, and wherein the output of said plurality of buffer means are connected to the input of said output means.

5. A selectable logic circuit according to claim 1 wherein said select means includes a P channel device having its source-drain path connected from said second logic power lead and said second buffer power lead to said second circuit power terminal and its gate connected to said select input, and an N channel device having its source-drain path connected from said second logic power lead and said second buffer power lead to said first circuit power terminal and its gate connected to said select input.

6. A selectable logic circuit according to claim 1 wherein said select means includes a switch means for connecting and disconnecting said second logic power leads and said second buffer power leads to said second circuit power terminal in response to a select and deselect signal respectively and a resistor connecting said second logic power leads and said second buffer power leads to said first circuit power terminal.

7. A selectable logic circuit according to claim 1 wherein said select means includes a switch means for connecting and disconnecting said second logic power leads and said second buffer power leads to said second circuit power terminal in response to a select and deselect signal respectively and a current source connecting said second logic power leads and said second buffer power leads to said first circuit power terminal.

8. A selectable logic circuit comprising:
circuit input means for receiving data input signals;
first and second circuit power terminals;
a plurality of logic means connected in parallel to said circuit input means for producing output signals at its output as a logical function of said data input signals and having first and second logic power leads;
a plurality of buffer means each connected to the output of a respective logic means and having first and second buffer power leads;
said first logic power lead and said first buffer power lead being continuously connected to said first circuit power terminal; and
select means having a select input and being connected to said first and second circuit power terminals, said logic means and said buffer means for connecting said second logic and said buffer power leads to said second circuit power terminal in response to a select signal and to connect the input of said buffer means to said first circuit power terminal in response to a deselect signal.

9. A selectable logic circuit according to claim 8 wherein said select means includes an N channel device having its source-drain path connected between said second logic and buffer power leads and said second circuit power terminal and its gate connected to said select input, and a P channel device having its source-drain path connected between said input of said buffer means and said first circuit power terminal and its gate connected to said select input.

10. A selectable logic circuit according to claim 8 including select means connected to each pair of logic means and buffer means, each of said select means being responsive to a separate select signal.

11. A selectable logic circuit according to claim 8 including an output means for providing a circuit output signal, and wherein the output of said plurality of buffer means are connected to the input of said output means.

12. A selectable logic circuit according to claim 8 wherein said select means includes a P channel device having its source-drain path connected between said logic and buffer power leads and said second circuit power terminal and its gate connected to said select input, and an N channel device having its source-drain path connected between said input of said buffer means and said first circuit power terminal and its gate connected to said select input.

13. A selectable logic circuit according to claim 8 wherein said select means includes a switch means for connecting and disconnecting said second logic and buffer power leads to said second circuit power terminal in response to a select and deselect signal respectively and a resistor connecting said input of said buffer means to said first circuit power terminal.

14. A selectable logic circuit according to claim 8 wherein said select means includes a switch means for connecting and disconnecting said second logic and buffer power leads to said second circuit power terminal in response to a select and deselect signal respectively and a current source connecting said input of said buffer means to said first circuit power terminal.

15. A selectable logic circuit comprising:
circuit input means for receiving data input signals;
first and second circuit power terminals;
a plurality of logic means connected in parallel to said circuit input means for producing output signals at its output as a logical function of said data input signals and having first and second logic power leads;
select means having a select input and being connected to said first and second circuit power terminals and said first and second logic power leads for connecting said first and second logic power leads to said first and second circuit power terminals respectively in response to a select signal and to disconnect said first and second logic power leads from said first and second circuit power terminals respectively in response to a deselect signal.

16. A selectable logic circuit according to claim 15 wherein said select means includes an N channel device having its source-drain path connected between said second logic power lead and said second circuit power terminal and its gate connected to said select input and a P channel device having its source-drain path connected between said first logic power lead and said first circuit power terminal and its gate connected to said select input by an inverter.

17. A selectable logic circuit according to claim 15 wherein said select means includes a P channel device having its source-drain path connected between said second logic power lead and said second circuit power terminal and its gate connected to said select input and an N channel device having its source-drain path connected between said first logic power lead and said first circuit power terminal and its gate connected to said select input by an inverter.

18. A selectable logic circuit according to claim 15 including of select means, connected to each logic means, each of said select means being responsive to a separate select signal.

19. A selectable logic circuit according to claim 15 including an output means for providing a circuit output signal, and wherein the output of said plurality of logic means are connected to the input of said output means.

20. A selectable logic circuit according to claim 19 wherein said output means includes an inverter, an N channel device having its source-drain path connecting a power lead of said inverter to said second circuit power terminal and its gate connected to an output select terminal, and a P channel device having its source-drain path connecting the input of said inverter to said first circuit power terminal and its gate connected to said output select terminal.

21. A selectable logic circuit according to claim 19 wherein said output means includes an inverter, a P channel device having its source-drain path connecting a power lead of said inverter to said first circuit power terminal and its gate connected to an output select terminal, and an N channel device having its source-drain path connecting the input of said inverter to said second power terminal and its gate connected to said output select terminal.

22. A selectable logic circuit according to claim 19 wherein said output means includes a switch means connecting and disconnecting a power lead of said output means to said second circuit power terminal in response to an output select and deselect signal respectively and a resistor connecting the input of said output means to said first circuit power terminal.

23. A selectable logic circuit according to claim 19 wherein said output means includes a switch means connecting and disconnecting a power lead of said output means to said second circuit power terminal in response to an output select and deselect signal respectively and a current source connecting the input of said output means to said first circuit power terminal.

24. A selectable logic circuit according to claim 15 including an output means one for each logic means for providing a circuit output signal and switch means connecting and disconnecting a power lead of said output means to said second circuit power terminal in response to an output select and deselect signal respectively and a resistor connecting the input of said output means to said first circuit power terminal.

25. A selectable logic circuit according to claim 15 including an output means one for each logic means for providing a circuit output signal and switch means connecting and disconnecting a power lead of said output means to said second circuit power terminal in response to an output select and deselect signal respectively and a current source connecting the input of said output means to said first circuit power terminal.

* * * * *